US008160527B2

(12) United States Patent
Jonsson et al.

(10) Patent No.: US 8,160,527 B2
(45) Date of Patent: Apr. 17, 2012

(54) AUTOMATIC GAIN CONTROL IN MULTI-CARRIER WIRELESS SYSTEMS

(75) Inventors: Elias Jonsson, Malmö (SE); Niclas Danielsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 434 days.

(21) Appl. No.: 12/414,202

(22) Filed: Mar. 30, 2009

(65) Prior Publication Data
US 2010/0248665 A1    Sep. 30, 2010

(51) Int. Cl.
*H04B 1/10* (2006.01)
(52) U.S. Cl. .................. 455/226.1; 455/234.2; 375/345
(58) Field of Classification Search .................. None
See application file for complete search history.

(56) References Cited

U.S. PATENT DOCUMENTS

| | | | |
|---|---|---|---|
| 6,480,528 B1 | 11/2002 | Patel et al. | |
| 6,819,706 B1 * | 11/2004 | Lim | 375/130 |
| 7,359,690 B2 * | 4/2008 | Lai | 455/240.1 |
| 7,809,343 B2 * | 10/2010 | Lai et al. | 455/234.1 |
| 7,978,773 B2 * | 7/2011 | Lai et al. | 375/260 |
| 2004/0151264 A1 * | 8/2004 | Montojo et al. | 375/345 |
| 2006/0264191 A1 * | 11/2006 | Lai | 455/127.2 |
| 2007/0054642 A1 * | 3/2007 | Bhardwaj et al. | 455/234.1 |
| 2008/0013654 A1 * | 1/2008 | Rick et al. | 375/345 |
| 2008/0139110 A1 * | 6/2008 | Lai et al. | 455/3.02 |
| 2008/0159446 A1 * | 7/2008 | Lai et al. | 375/345 |
| 2008/0170606 A1 | 7/2008 | Rodal et al. | |
| 2008/0267326 A1 * | 10/2008 | Lai et al. | 375/345 |
| 2008/0268798 A1 * | 10/2008 | Lai et al. | 455/127.2 |
| 2009/0110047 A1 * | 4/2009 | Lai et al. | 375/232 |

FOREIGN PATENT DOCUMENTS
WO    2008/009007 A2    1/2008

* cited by examiner

*Primary Examiner* — Thomas J Hiltunen
(74) *Attorney, Agent, or Firm* — Coats & Bennett, P.L.L.C.

(57) ABSTRACT

Methods and apparatus for providing automatic gain control (AGC) for received multi-carrier signals are disclosed. A receiver circuit comprises a common analog signal path, which includes an analog variable-gain circuit and an analog-to-digital converter, and further comprises first and second carrier-specific, digital variable-gain circuits corresponding to first and second carriers of the received multi-carrier signal, respectively. The receiver circuit further includes a gain control circuit configured to control the analog and digital variable-gain circuits and to allot gain adjustments to the analog variable-gain circuit based on a difference between carrier signal levels for the first and second carriers. In some embodiments, the gain control circuit selectively operates in an all-carrier mode, in which analog gain adjustments are calculated from both of the carrier signal levels, or in an unequal-priority mode, in which analog gain adjustments are calculated from only one of the first and second carrier signal levels.

26 Claims, 6 Drawing Sheets

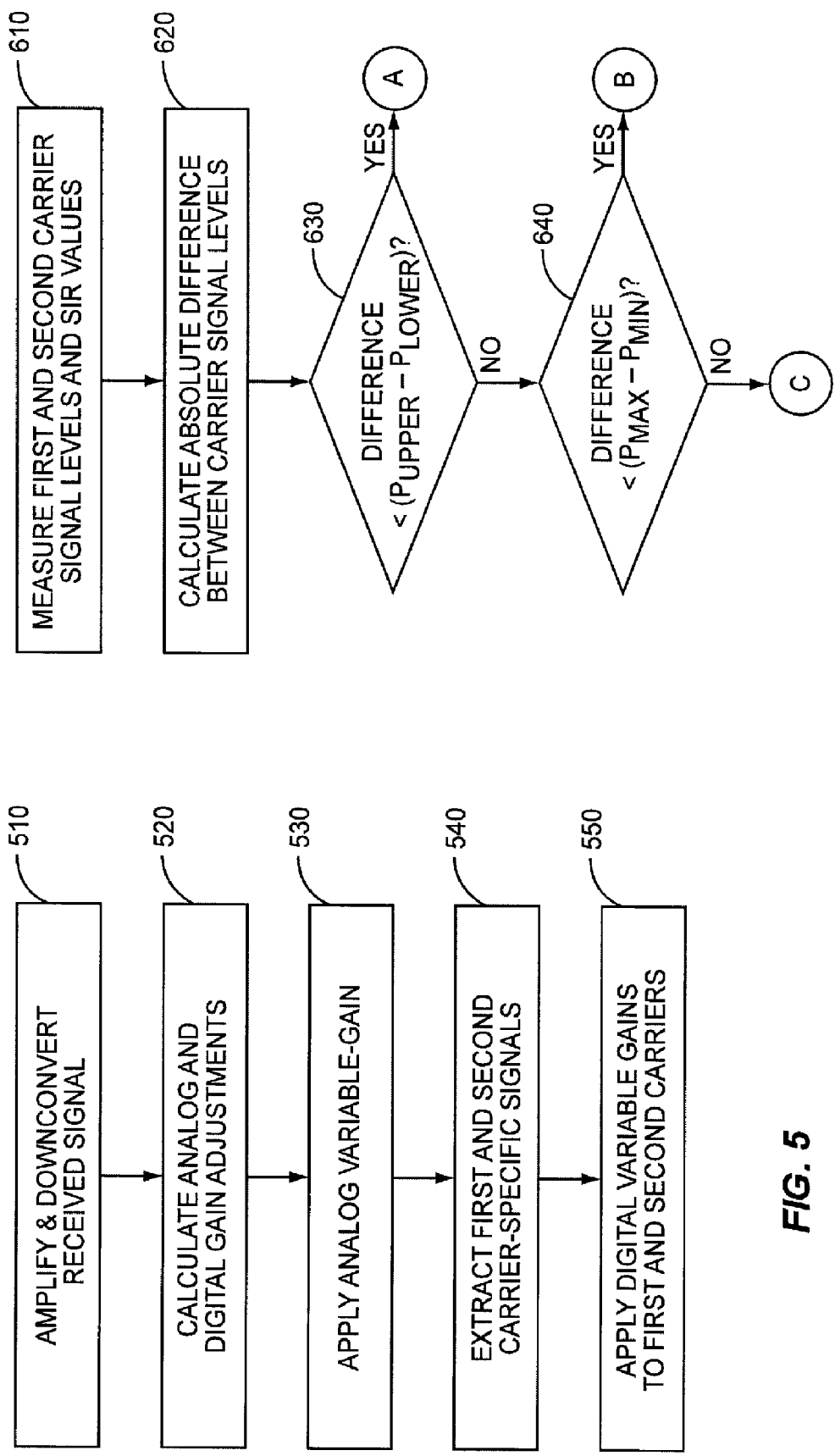

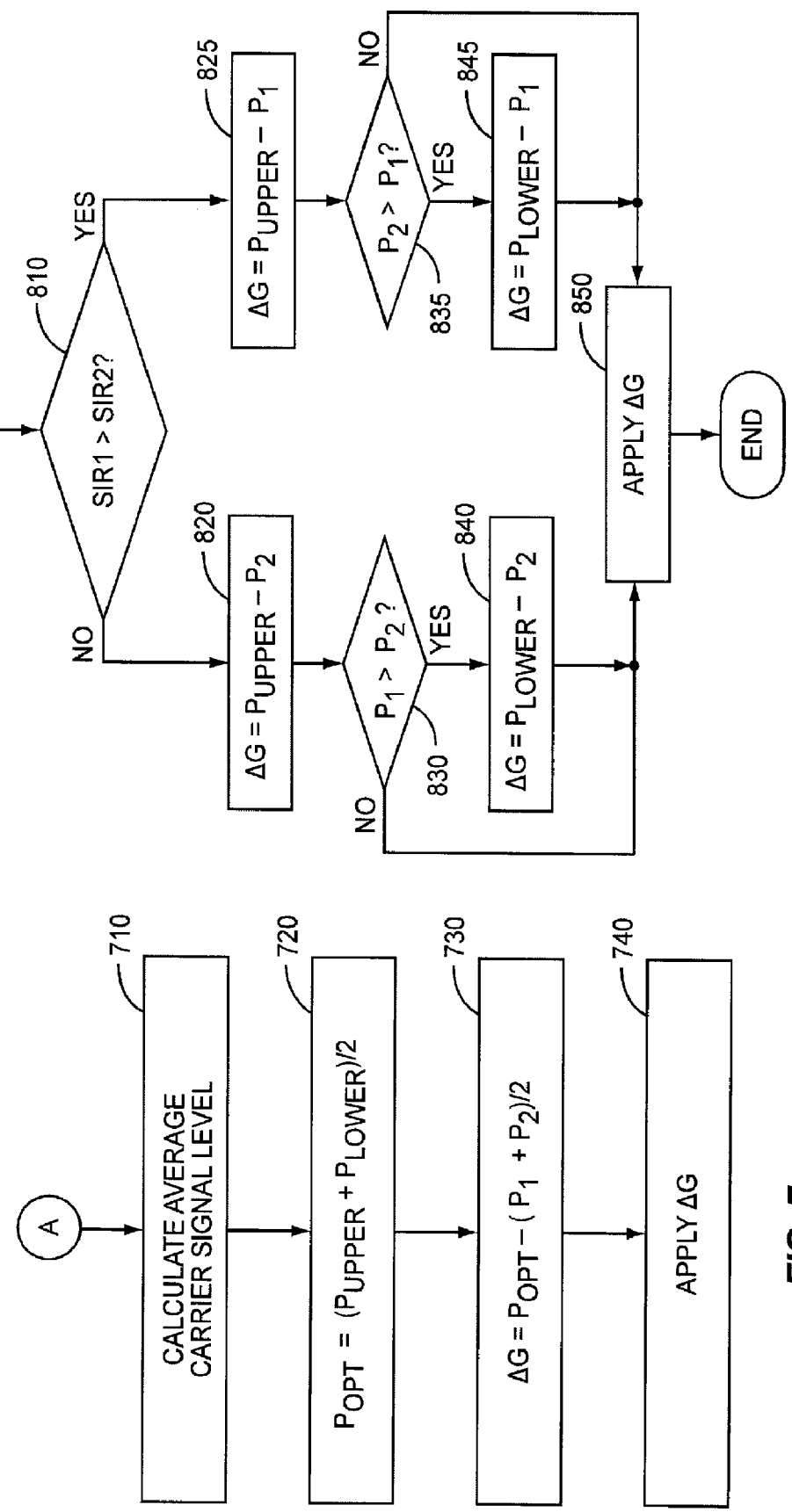

AUTOMATIC GAIN CONTROL IN MULTI-CARRIER WIRELESS SYSTEMS

TECHNICAL FIELD

The present invention relates generally to multi-carrier wireless telecommunication systems and relates in particular to methods and apparatus for automatic gain control in multi-carrier wireless receivers.

BACKGROUND

Automatic gain control (AGC) is widely used for handling varying received signal strengths in wireless receivers. A typical AGC control system measures the signal strength of the received signal, e.g., by analyzing a digitized data stream, and compares the measured signal level to a desired signal strength, a so-called set point. The difference between the measured signal strength and the desired signal level is used to control one or several amplifiers, to keep the output signal as constant as possible with respect to signal strength, or within a desired range, at a given reference point in the receive path. In many systems, the signal strength is processed in logarithmic units, so that the gain control system has a linear response with respect to decibels.

In a digital wireless system, the received signal is initially an analog signal that must be converted into digital form to extract the encoded digital information. The analog-to-digital (A/D) converter used for this conversion has limits on its dynamic range, and often has a dynamic range that is far less than the desired system dynamic range for the receiver. This means that the analog gain of the receiver path must be regulated, based on the received signal strength, before the signal is converted to digital form. However, conventional techniques for regulating the analog gain of the system can give rise to undesired transient effects. For instance, each analog gain adjustment typically results in a change in DC offset in the digitized signal, in addition to the gain change. This unwanted effect can distort the signal and cause degraded performance. Although these DC offset changes can be mitigated with high pass filtering, frequent analog gain changes will still cause degradation of the signal, since it takes a while to remove the offset of each gain change by this filtering.

One way to minimize such transient effects is to make as much use of the dynamic range at the A/D converter as possible, thus adjusting the analog gain prior to the converter only when necessary, e.g., only when the received signal strength passes outside some pre-defined boundaries. Remaining gain adjustments, e.g., to provide a level signal for digital demodulation, may then be performed in the digital domain, e.g., using a digital gain amplifier (DGA). These digital gain changes do not give rise to distorting transient effects.

In a multi-carrier system, two or more distinct radio-frequency carriers are placed close to one another in frequency, with both carrying information targeted to a given receiver. As specified by the $3^{rd}$-Generation Partnership Project (3GPP) for Wideband Code-Division Multiple Access (W-CDMA) systems, a W-CDMA multi-carrier system in its simplest form uses two adjacent carriers of width 3.84 MHz, with approximately 5 MHz spacing between the carrier center frequencies. However, the 3GPP standards also support use of different spacing and different numbers of carriers.

Regardless of the details of carrier spacing and bandwidth, each carrier will be subject to different variations in received signal strength as received through the antenna or antennas of a wireless receiver, even if the carriers are transmitted with identical signal levels. Thus, one approach to automatic gain control in a multi-carrier receiver is to use two independent receiver chains, each with a separate and independent AGC system. The independent AGC systems provide each carrier with the gain changes needed to keep that signal constant in signal strength. However, this approach can be very expensive in terms of receiver components and integrated circuit chip area, which translate directly to production cost for the receiver. Furthermore, to the extent that independent receiver chains are used for each carrier, the power consumption of the receiver will tend to increase linearly with the number of carriers. Since market pressures make it very important to keep the number of radio parts and the power consumption as low as possible, multi-carrier receiver designs that re-use several components of the receiver are highly desirable.

SUMMARY

In several embodiments of the present invention, a receiver circuit configured for processing multi-carrier signals comprises a common analog signal path, for conditioning the received multi-carrier signal and converting the received multi-carrier signal into digital form, and at least first and second carrier-specific paths for extracting first and second distinct carriers, respectively, from the digitized signal and for processing the carrier-specific signals to obtain the transmitted information. The common analog signal path includes an analog variable-gain circuit, such as an analog variable-gain amplifier, prior to an analog-to-digital converter. The first and second carrier-specific paths include first and second carrier-specific, digital variable-gain circuits, respectively. The receiver circuit further comprises a gain control circuit configured to control the analog variable-gain circuit and the digital variable-gain circuits and to allot gain adjustments to the analog variable-gain circuit based on a difference between carrier signal levels for the first and second carriers.

In some embodiments, the gain control circuit is further configured to selectively operate, based on the difference between the first and second carrier signal levels, in an all-carrier mode, in which gain adjustments for the analog variable-gain circuit are calculated from both of the first and second carrier signal levels, or in one of one or more unequal-priority modes, in which gain adjustments for the analog variable-gain circuit are calculated from only one of the first and second carrier signal levels. In some of these embodiments, the gain control circuit is further configured to calculate gain adjustments for each of the digital variable-gain circuits based on the corresponding first or second carrier signal levels and previously calculated gain adjustments for the analog variable-gain circuit.

Exemplary embodiments of the gain control circuit are configured to operate in the all-carrier mode when the difference between the first and second carrier signal levels is less than a first pre-determined threshold and to calculate gain adjustments for the analog variable-gain circuit, when in the all-carrier mode, based on an average of the first and second carrier signal and a pre-determined optimal input level for the analog-to-digital converter. In some embodiments, the one or more unequal-priority modes include a signal-to-interference-ratio mode (SIR mode), in which the gain control circuit is configured to calculate gain adjustments for the analog variable-gain circuit based on the carrier signal level for the one of the first and second carriers having the higher signal-to-interference ratio. In some of these embodiments, the gain control circuit is configured to operate in the SIR mode when the difference between the first and second carrier signal levels is between first and second pre-determined thresholds, and to calculate gain adjustments for the analog variable-gain circuit, when in the SIR mode, based on the carrier signal level for the one of the first and second carriers having the higher signal-to-interference ratio (SIR) and a selected one of two pre-determined target input levels for the analog-to-digital converter. The gain control circuit may be further configured to select the upper one of the two pre-determined target input levels for calculating the adjustments when the carrier having the higher signal-to-interference ratio also has the higher carrier signal level and to select the lower one of the two pre-determined target input levels for calculating the adjustments when the carrier having the higher signal-to-interference ratio has the lower carrier signal level, in these embodiments.

Some of the above embodiments are further configured to selectively operate in a dropped-carrier mode, in which the gain control circuit is configured to calculate gain adjustments for the analog variable-gain circuit based on the higher of the first and second carrier signal levels. The gain control circuit in these embodiments may be configured to operate in the dropped-carrier mode when the difference between the first and second carrier signal levels is greater than a pre-determined maximum threshold, and to calculate gain adjustments for the analog variable-gain circuit, when in the dropped-carrier mode, based on the higher of the first and second carrier signal levels and a selected one of a pre-determined optimal input level for the analog-to-digital converter and a pre-determined maximum input level for the analog-to-digital converter. In some of these embodiments, the gain control circuit is further configured, when in the dropped-carrier mode, to determine whether the carrier having the lower signal level is deemed to have higher priority, and to base the calculated gain adjustments for the analog variable-gain circuit on the pre-determined maximum input level and the higher of the carrier signal levels when the carrier having the lower signal level is deemed to have higher priority, otherwise basing the calculated gain adjustments for the analog variable-gain circuit on the pre-determined optimum input level and the higher of the carrier signal levels.

Other embodiments of the invention include methods for processing a received multi-carrier signal, including methods that generally correspond to the apparatus discussed above. These methods may be implemented using a suitable wireless receiver or gain control circuit. An exemplary method for processing a received multi-carrier signal thus comprises conditioning the received multi-carrier signal and converting the received multi-carrier signal into a digital signal, using a common analog signal path comprising an analog variable-gain circuit and an analog-to-digital converter, extracting first and second carrier-specific signals from the digital signal, adjusting the first and second carrier-specific signals using first and second carrier-specific, digital variable-gain circuits, respectively, and allotting gain adjustments to the analog variable-gain circuit based on a difference between carrier signal levels for the first and second carriers.

In particular, some embodiments comprise selecting, based on a difference between the first and second carrier signal levels, an all-carrier mode, in which the gain adjustments for the analog variable-gain circuit are calculated from both of the first and second carrier signal levels, or one of one or more unequal-priority modes, in which gain adjustments for the analog variable-gain circuit are calculated from only one of the first and second carrier signal levels.

Of course, those skilled in the art will appreciate that the present invention is not limited to the above features, advantages, contexts or examples, and will recognize additional features and advantages upon reading the following detailed description and upon viewing the accompanying drawings.

BRIEF DESCRIPTION OF THE DRAWINGS

FIG. 5 is a process flow diagram illustrating a general method of processing a received multi-carrier signal according to some embodiments of the present invention.

FIG. 6 is a process flow diagram illustrating an exemplary method of selectively operating an automatic gain control circuit based on first and second carrier signal levels.

FIGS. 7, 8, and 9 are process flow diagrams illustrating details for calculating analog gain control adjustments, according to some embodiments of the present invention.

DETAILED DESCRIPTION

Although embodiments of the present invention are described herein with respect to multi-carrier operation in W-CDMA systems, those skilled in the art will recognize that the inventive techniques disclosed and claimed herein are not so limited and may be advantageously applied to a wide array of multi-carrier wireless systems, such as a multi-carrier Long-Term Evolution (LTE) system, a multi-carrier Enhanced Data rates for GSM Evolution (EDGE) system, or the like. Furthermore, the use of the term "exemplary" is used herein to mean "illustrative," or "serving as an example," and is not intended to imply that a particular embodiment is preferred over another or that a particular feature is essential to the present invention. Likewise, the terms "first" and "second," and similar terms, are used simply to distinguish one particular instance of an item or feature from another, and do not indicate a particular order or arrangement, unless the context clearly indicates otherwise.

Figure 1:
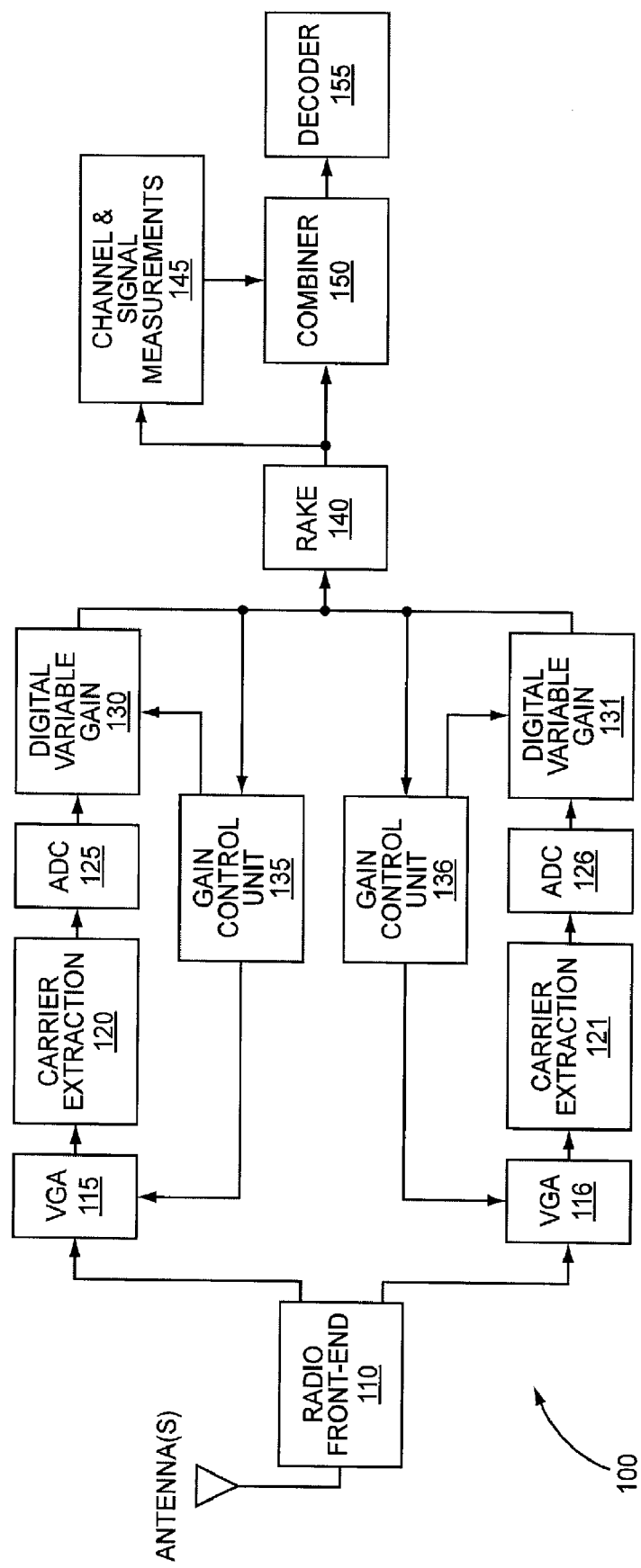
FIG. 1 is a block diagram of a multi-carrier wireless receiver with separate analog gain control for each carrier.

FIG. 1 illustrates a wireless receiver 100 for multi-carrier operation in which a distinct receiver chain is maintained for each carrier, each receiver chain comprising both an analog variable-gain circuit and a digital variable-gain circuit. In particular, the multi-carrier signal received by one or more antennas is processed by radio front-end circuit 110 (which may comprise a duplexing filter or switch, one or more low-noise amplifiers, one or more radio-frequency filters, or the like) and split into two carrier-specific branches. The top branch comprises an analog variable-gain amplifier (VGA) 115, a carrier extraction circuit 120 (which may comprise, for example, one or more filters, a tuned down-converter circuit, etc.), an analog-to-digital (A/D) converter 125, and a digital variable-gain circuit 130. The analog VGA 115 and digital variable-gain circuit 130 are controlled by gain control unit 135, based on carrier-specific signal levels derived from the digitized carrier-specific signal. A similar VGA 116, carrier extraction circuit 121, A/D converter 126, digital variable-gain circuit 131, and gain control unit 136 are provided for the lower branch, with the circuits tuned as necessary for the different carrier frequency. In the pictured receiver 100, further processing of the digitized, carrier-specific signals is carried out by RAKE receiver 140, channel & signal measurement circuit 145, combiner 150, and decoder 155. Although shown as common blocks, those skilled in the art will appreciate that the carrier-specific signals may generally be processed separately in these functional blocks by allocating processing resources, such as RAKE fingers, processor time, etc., to each carrier. Because the details of these processing blocks are not necessary to a full understanding of the present invention, further details are not provided herein.

Those skilled in the art will readily appreciate that the simple solution illustrated in FIG. 1 allows the gain of each carrier to be independently adjusted, without coordination. However, this simplicity comes at a cost, as several components, such as the analog variable-gain amplifiers and the A/D converters, are duplicated. This drives up the cost and power consumption of the multi-carrier receiver.

Figure 2:
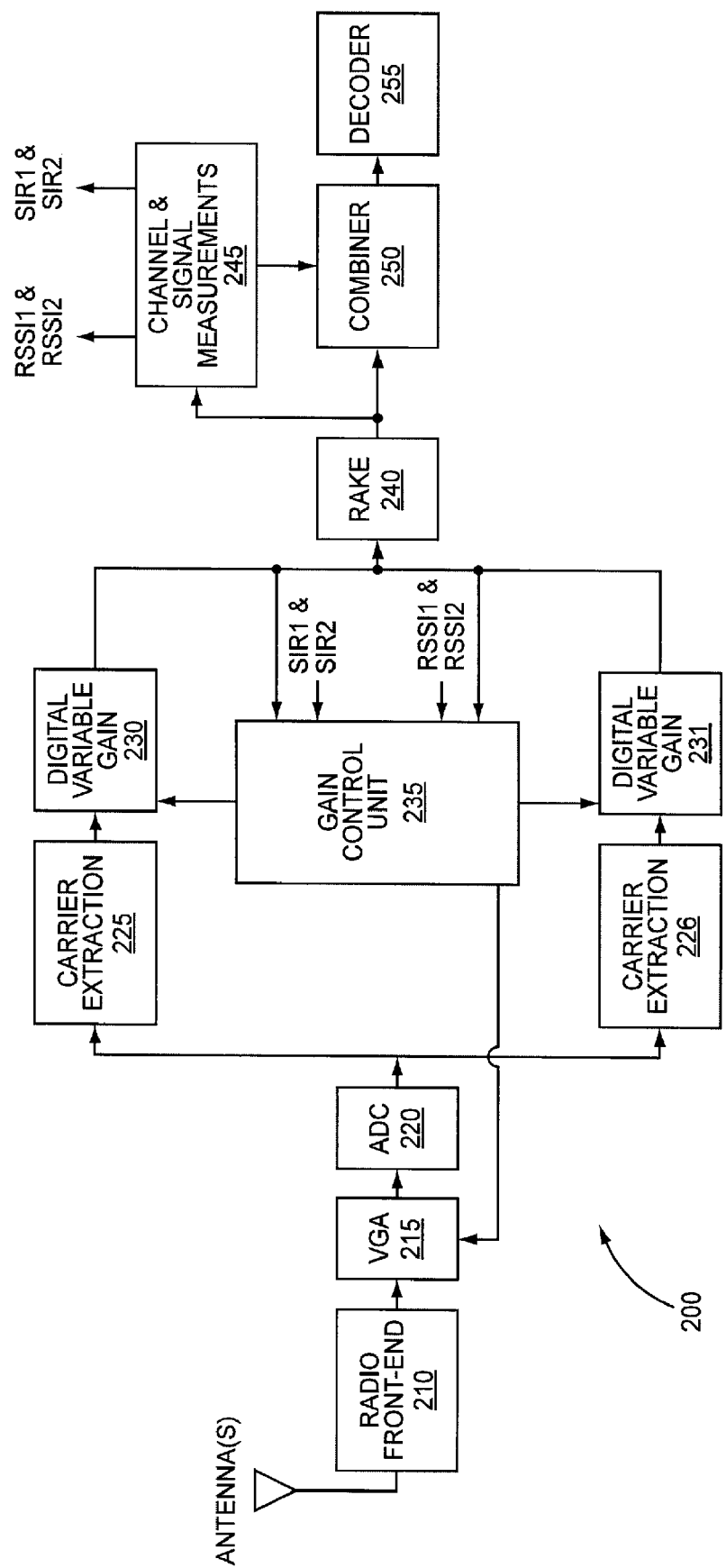
FIG. 2 is a block diagram of a multi-carrier wireless receiver, with common analog gain control, according to some embodiments of the present invention.

In several embodiments of the present invention, as pictured in FIG. 2, the receiver chain comprises an extended common analog path and first and second carrier-specific portions. The common analog path receives and conditions multiple carriers, but treats the received signal as if it included just one carrier. The receiver thus filters and amplifies the received carriers with a single receive chain, and performs A/D conversion on the received signal as though it comprised only a single carrier with a very broad bandwidth. As shown in FIG. 2, the common analog signal path may thus comprise, in some embodiments, a radio front-end circuit 210, a common analog variable-gain circuit 215, and a common A/D converter 220. Of course, although FIG. 2 illustrates a single analog variable-gain element 215 separate from the radio front-end circuit 210, those skilled in the art will appreciate that the analog variable-gain element 215 may be split into two or more sub-circuits, in some embodiments, or may be integrated into the radio front-end circuit, in others. For instance, the analog variable-gain element may comprise only a single variable-gain low-noise amplifier, positioned very close to the input amplifier and part of the radio front-end circuit 210, in some embodiments, a variable-gain amplifier positioned further downstream in other embodiments, or a combination of both in still other embodiments.

In the second portion of the receiver, i.e., after the A/D converter 220, the individual carriers are extracted and processed individually, using carrier extraction circuits 225 and 226 and digital variable-gain circuits 230 and 231. A single automatic gain control (AGC) unit 235 has access to the variable-gain circuits (i.e. VGA 215 and digital variable-gain circuits 230 and 231) in each of these two different receiver portions. The digital variable-gain circuits 230 and 231 are followed by RAKE receiver 240, channel & signal measurements circuit 245, combiner 250, and decoder 250; as with the corresponding circuits in FIG. 1, the detailed operation of these circuits is well known to those skilled in the art and is not discussed further herein.

Although the common analog variable-gain circuit 215 in the pictured embodiment comprises a single amplifier, referred to in the following discussion as a variable-gain amplifier (VGA), those skilled in the art will appreciate that an analog variable-gain circuit may comprise two or more amplifiers, in some embodiments, and may even comprise one or more variable-attenuation circuits, in other embodiments. In any case, the analog variable-gain circuit in various embodiments is common for two or more carriers of a received multi-carrier signal, and is situated before A/D conversion and carrier extraction occurs.

The carrier-specific, digital variable-gain circuits 230 and 231, sometimes referred to herein as a digital variable-gain amplifiers (DVGAs), are situated after A/D conversion and carrier extraction. Because this portion of the receiver processes the individual carriers of the multi-carrier signal separately, there is one such digital variable-gain circuit for each carrier. Generally speaking, many embodiments of these DVGAs may operate by multiplying samples of the extracted carrier by a scale factor. However, those skilled in the art will appreciate that a number of techniques for adjusting the level of a digitized signal are possible, and that not all of these techniques necessarily include "amplification" per se.

AGC circuit 235 coordinates the gain adjustments needed for the two carriers, controlling the analog variable-gain circuit and the digital variable-gain circuits and allotting gain adjustments to the variable-gain circuits based on the carrier signal levels and signal-to-interference ratios (SIRs). In particular, as will be described in further detail below, the gain control circuit 235 allots adjustments to the analog variable-gain circuit by selectively operating in one of two or more operating modes based on the difference in carrier signal levels for the carriers of the multi-carrier signal. These operating modes include at least a dual-carrier mode, in which gain adjustments for the analog variable-gain circuit are calculated from both of the first and second carrier signal levels, and one or more unequal-priority modes, in which gain adjustments for the analog variable-gain circuit are calculated from only one of the first and second carrier signal levels.

Figure 4:
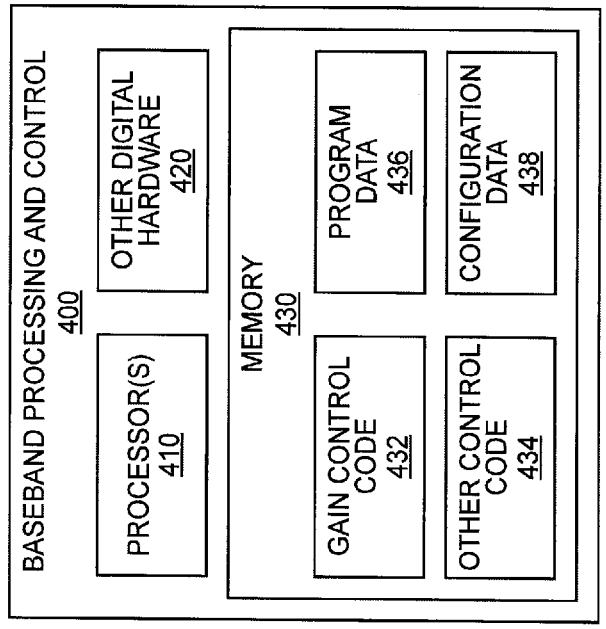
FIG. 4 is a block diagram of an exemplary baseband processing and control circuit.

Those skilled in the art will appreciate that AGC unit 235 may be implemented using digital hardware, one or more appropriately programmed programmable circuits, or a combination thereof, in various embodiments. In some embodiments, AGC unit 235 may be implemented as part of a more general baseband processing circuit, such as the baseband and processing and control circuit 400 pictured in FIG. 4. Baseband processing and control circuit 400, which may be configured to carry out a number of signal processing and receiver control operations in addition to carrying out automatic gain control functions, includes one or more processors 410, other digital hardware 420, and memory 430, which in turn includes gain control program code 432, other control program code 434, program data 436, and configuration data 438, for use by processor(s) 410. Those skilled in the art will appreciate that gain control program code 432 may comprise, in these embodiments, program instructions for carrying out one or more of the specific automatic gain control processes described herein.

Although pictured as a single, monolithic block in FIG. 2, the gain control unit 235 may be viewed, in some embodiments, as processing separate gain adjustment requests generated by a control loop for each of the carrier-specific, digital processing paths. In some embodiments, these requests, generated by comparing the measured carrier signal level for a particular carrier to a desired level, may comprise a single gain adjustment request, leaving the allocation of the requested gain adjustment between the analog and digital variable-gain circuits to the "master" control circuit. In others, an independent AGC algorithm may be executed for each of the carrier-specific paths, in which case the requested adjustment may already be broken into a requested analog gain adjustment and a requested digital gain adjustment. This latter approach may be advantageous in a receiver which is expected to sometimes receive only a single carrier. During these instances, the independent AGC algorithm may then be operated without modification, and the multi-carrier AGC coordination described herein is not needed. In the discussion immediately following, this latter approach is generally assumed, although those skilled in the art will appreciate that other embodiments of the invention may implement a single, unified control algorithm for which separate, carrier-specific AGC "requests" are not expressly generated.

In any case, since there are at least two receiver chains in the receiver, one for each carrier, but only a single common analog variable-gain circuit, each receiver path will "request" or require separate individual gain changes to best control the power of the receiver path's specific carrier. Thus, a centralized control circuit decides how to make the best use of the available gain-adjustment resources, and thus how to best accommodate the differing and sometimes conflicting gain control needs from the two or more paths. In extreme cases, e.g., where there are strong fading effects which cause large differences in received signal levels between the two or more carriers, the control circuit must decide how to prioritize between the two carriers.

In some embodiments of the present invention, the receiver is thus configured to selectively operate in one of three distinct AGC "modes" at any given time, depending on the relative power levels of the carriers involved. If the power levels are close enough to one another, the analog gain changes to be used can be calculated as averages of the individual requested analog gain changes from the AGC. Specifically, in some embodiments, the gain control circuit is configured to operate in this first mode when the difference between carrier signal levels is less than a first pre-determined threshold, and to calculate gain adjustments for the analog variable-gain circuit, when in this first mode, so that the average of the carrier signal levels at the input to the A/D converter falls at or near a pre-determined optimal input level for the A/D converter. Although this first operating mode is referred to herein as "dual-carrier mode", those skilled in the art will appreciate that the techniques described here may be generalized to receivers handling two or more carriers, in which case the mode might instead be referred to as an "all-carrier mode." In this mode, as with the others described below, the gain control circuit calculates gain adjustments for each of the digital variable-gain circuits based on the corresponding carrier levels and the previously calculated adjustments for the analog variable-gain circuit. In other words, any remaining gain adjustments necessary to bring the carrier-specific signals to a desired signal level for demodulation and other processing are allotted to the carrier-specific digital variable-gain circuits.

In a second operating mode, the power levels of the two (or more) carriers differ enough that they cannot be adjusted with the common analog gain adjustments to all fit within pre-determined upper and lower limits at the input to the A/D converter, but can nonetheless be adjusted to fall within pre-determined absolute maximum and minimum limits. In this operating mode, referred to hereinafter as "SIR mode," the gain control circuit calculates gain adjustments for the analog variable-gain circuit based on the carrier signal level for the one of the first and second carriers having the higher signal-to-interference ratio. Specifically, in some embodiments, the gain control circuit is configured to control the analog variable-gain circuit so that the carrier having the higher SIR is at or near an upper pre-determined target input level if that carrier also has the highest carrier signal level. If the carrier having the higher SIR has the lower carrier signal level, the gain control circuit instead adjusts the analog gain so that the carrier with the higher SIR falls at or near a lower pre-determined target input level. In this manner, the carrier with the best SIR is given priority by the AGC circuit, but in a manner that tends to minimize any harm to the other carrier(s).

Finally, a third operating mode applies to situations where the carrier signal levels are so different that the two (or more) carriers cannot simultaneously be adjusted to fit within pre-determined maximum limits for the A/D converter input level. In this mode, called "dropped-carrier mode" in the discussion that follows, the gain control circuit is configured to calculate gain adjustments for the analog variable-gain circuit based on the higher of the carrier signal levels. Specifically, in some embodiments, the gain control circuit is configured to operate in the dropped-carrier mode when the difference between the first and second carrier signal levels is greater than a pre-determined maximum threshold, and to calculate gain adjustments for the analog variable-gain circuit, when in the dropped-carrier mode, based on the higher of the of carrier levels and either a pre-determined optimal input level for the A/D converter or a pre-determined maximum input level for the A/D converter.

This choice depends on whether one of the carriers is deemed to have priority over the others. If one of the carriers is a so-called "anchor" carrier and has a lower signal level than the other(s), then the gain control circuit is configured to set the higher-level carrier to the maximum input level for the A/D converter. On the other hand, if the anchor carrier has the highest signal level, the AGC circuit instead adjusts the analog gain so that the anchor carrier is at or near an optimal input level for the A/D converter. If none of the carriers has priority over the others, the higher-level carrier is adjusted to fall at or near the optimal input level for the A/D converter.

Following is a more detailed discussion of the above-described operating modes, with reference to the receiver circuit 200 of FIG. 2. Those skilled in the art will appreciate that the specific techniques described herein may be readily adapted to other receiver circuits that comprise a common analog signal path for conditioning the received multi-carrier signal and converting the received multi-carrier signal into digital form, including an analog variable-gain circuit and an A/D converter, and two (or more) carrier-specific digital variable-gain circuits corresponding to the extracted carriers.

Referring to the receiver 200 of FIG. 2, if $g_v$ denotes the voltage gain of the receiver chain from the antenna to the input of the A/D converter 220, then the expression $\sqrt{RSSI}*g_v$ gives information about the signal strength at the input to the A/D converter 220, where RSSI (received signal strength indicator) is a measure of the received signal power referred to the antenna. For a dual-carrier receiver there will be separate RSSI values for each of the carriers, denoted herein as $RSSI_1$ and $RSSI_2$. The signal strength in decibels (dB) at the A/D converter 220 for each carrier may then be denoted by $P_1=20 \log_{10}(\sqrt{RSSI_1}*g_v)$ and $P_2=20 \log_{10}(\sqrt{RSSI_2}*g_v)$, respectively. In the discussion that follows, power levels, gains, and gain adjustments are generally in units of dB, unless otherwise specified. Thus, for consistency in units, the analog gain $g_v$ may be converted to a gain in dB $g_a$, where $g_a=20 \log(g_v)$. Those skilled in the art will further appreciate that carrier power levels, when in units of dB, may be referenced to any of several reference levels, such as milliwatts (dBm) or watts (dBW), or to any arbitrary reference level. This reference level is unspecified in the discussion that follows.

These measures of the carrier signal levels into the A/D converter 220 may be compared to pre-determined upper and lower limits for these signal strengths denoted (in dB) by $P_{MAX}$ and $P_{MIN}$, respectively. If the implemented analog gain adjustments force either carrier into a lower power level than its defined $P_{MIN}$, then that carrier is effectively dropped from consideration by the AGC circuit. The AGC circuit then operates in a so-called single-carrier mode (or a reduced-carrier mode, if more than two carriers), centering on the remaining carrier (or carriers). The "dropped" carrier may still be demodulated, but may provide significantly reduced throughput, due to the lower signal level. Although the limits $P_{MAX}$ and $P_{MIN}$ might be individualized for each carrier, the following description assumes that they are the same, to make the description easier to read. However, those skilled in the art will appreciate that the extension of the techniques described below to the more general case is straightforward; this generally holds for all such limits defined in the detailed description below.

In some embodiments, an additional set of "stricter" upper and lower limits $P_{UPPER}$ and $P_{LOWER}$ may be introduced. These limits are stricter in the sense that the range from $P_{UPPER}$ and $P_{LOWER}$ falls entirely within the range $P_{MAX}$ to $P_{MIN}$. In other words, $P_{LOWER} \geq P_{MIN}$ and $P_{UPPER} \leq P_{MAX}$ for both carriers. As will be illustrated in more detail below, if the difference between the carrier signal levels is greater than the difference between $P_{UPPER}$ and $P_{LOWER}$, so that both carriers cannot be maintained within those limits, but the difference is not so great that the carriers cannot be maintained between the $P_{MAX}$ and $P_{MIN}$, then the AGC circuit can still take both carriers into account, but will use the measured signal-to-interference ratio (SIR) for each carrier, together with the $P_{MAX}$ and $P_{MIN}$ limits, to determine how to allot gain adjustments between the analog variable-gain circuit and the digital paths. In the discussion that follows, this mode is called "SIR mode."

Those skilled in the art will appreciate that if the pre-determined thresholds are selected so that $P_{LOWER}=P_{MIN}$ and $P_{UPPER}=P_{MAX}$, then a simpler circuit results, in which either all carriers are considered, and maintained within the limits, or the weaker carrier is dropped. In this case, the intermediate situation where the SIR of each carrier is compared is not considered. This model follows automatically as a limiting case of the general model.

In any event, given the three operating modes discussed above, two difference thresholds may be computed from the pre-determined signal level limits. In particular:

$$\Delta_1 = P_{UPPER} - P_{LOWER}, \tag{1}$$

and $$\Delta_2 = P_{MAX} - P_{MIN}, \tag{2}$$

If it is assumed that the center (in dB) of the converter's operating range is optimal in some sense, then the optimal A/D converter input level (in dB) can be written as $$P_{OPT} = \frac{P_{UPPER} + P_{LOWER}}{2}. \tag{3}$$

For embodiments in which separately implemented carrier-specific AGC algorithms each separately request an analog VGA gain change and a digital gain change, the requested analog gain changes from each AGC algorithm may be denoted (in dB), with respect to $P_n$, as $\delta g_1$, and $\delta g_2$ respectively. Furthermore, the requested digital gain changes (in dB) from each AGC algorithm may be denoted $\delta d_1$ and $\delta d_2$, respectively. In these embodiments, if $P_{LOWER} \leq P_n \leq P_{UPPER}$ for carrier n, then the corresponding carrier-specific algorithm should request a gain change only for the DGA, as changes to the analog gain should only be made when necessary. On the other hand, if $P_n$ is outside that range, an analog gain change that aims at setting $P_n = P_{OPT}$ will be requested, as the individual algorithms will choose their respective requested gain changes independently of each other, i.e., without consideration of the signal levels for the other carrier(s).

In operating modes where both carriers are used, the gain control circuit can have two (or more) analog gain adjustment requests, and must therefore determine how to convert these requests into a single analog gain adjustment. Of course, if the resulting analog gain change differs from the analog gain change requested for a specific carrier, then the digital gain adjustment for carrier may be easily compensated to account for the difference between the actually applied analog gain and the requested analog gain for that carrier. In this manner, each receiver path will get the overall total gain change it requests, although not necessarily distributed between the analog and digital adjustments in the manner originally requested.

Before each gain change, the difference in amplitudes between the two carriers are calculated as:

$$\Delta = |P_1 - P_2|, \tag{4}$$

where $P_1$ and $P_2$ are the latest measured carrier-specific signal strengths, referred to the input of the A/D converter 220. The value of $\Delta$ may be used to determine which operating mode should be used.

Figure 3A:
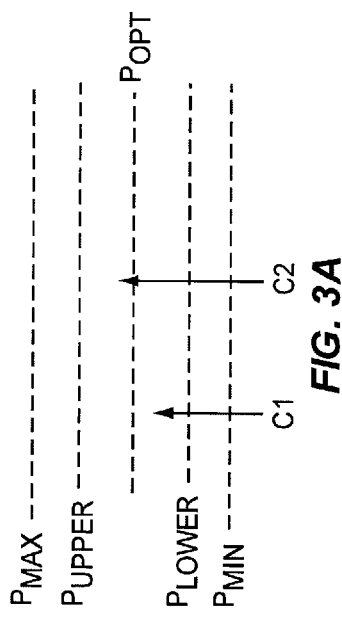
FIGS. 3A, 3B, and 3C illustrate carrier signal levels versus pre-determined analog-to-digital converter reference levels, under three separate scenarios.

For instance, if $\Delta \leq \Delta_1$ (where $\Delta_1$ is defined in Equation (1)), then both carriers' signal strengths fit within the inner pre-defined dynamic window. This is the case illustrated by carriers C1 and C2 in FIG. 3A, and may be considered the "normal" operating mode, or the "dual-carrier" or "all-carrier" operating mode. When in this mode, there are two general cases for the gain change. In the first case, the requested analog gain adjustments are both zero, i.e., $\delta g_1 = \delta g_2 = 0$. This case is trivial, as no adjustment to the analog variable-gain circuit is needed. Any gain changes that are needed are implemented by the carrier-specific digital variable-gain circuits.

In the second case, at least one of the requested analog gain changes is not zero, i.e., $\delta g_1 \neq \delta g_2$ or $\delta g_1 = \delta g_2 \neq 0$. In this case, the analog variable-gain circuit should be adjusted so that the amplitudes of the two carriers are centered symmetrically around the optimal amplitude $P_{OPT}$. Expressing this in terms of the requested gain changes from the AGC's and the optimal signal level $P_{OPT}$:

$$\delta \tilde{g} = P_{OPT} - \frac{P_1 + P_2}{2}, \tag{5}$$

where $\delta \tilde{g}$ is the adjustment to the analog variable-gain circuit, relative to the previous setting. Once the analog gain adjustment is calculated, then gain adjustments for each of the digital variable-gain circuits may be calculated, based on the corresponding carrier signal levels and $\delta \tilde{g}$:

$$\delta \tilde{g}_1 = \delta d_1 - (\delta \tilde{g} - \delta g_1), \text{ and} \tag{6}$$

$$\delta \tilde{d}_2 = \delta d_2 - (\delta \tilde{g} - \delta g_2), \tag{7}$$

where $\delta d_i$ is the requested digital gain adjustment and $\delta \tilde{d}_i$ the calculated digital gain adjustment for carrier i, relative to the previous gain setting for the digital variable-gain circuit.

After implementing these gain changes, the new analog gain for the common analog signal path is:

$$g_a = g_{a,old} + \delta \tilde{g}, \tag{8}$$

and the new digital gain for each carrier-specific receiver path is:

$$d_n = d_{n,old} + \delta \tilde{d}_n, \tag{9}$$

where $d_{n,old}$ and $g_{a,old}$ are the corresponding values before update.

Figure 3B:
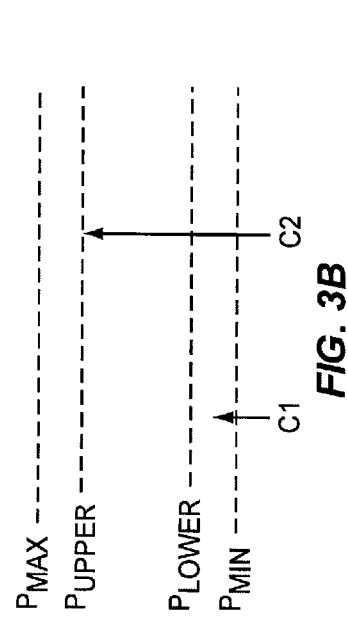

If $\Delta_1 \leq \Delta \leq \Delta_2$, the carriers cannot be adjusted to both fit between $P_{UPPER}$ and $P_{LOWER}$, but can be adjusted to fit within the extended dynamic window, i.e., between $P_{MAX}$ and $P_{MIN}$. An example of this scenario is illustrated in FIG. 3B, where carrier C2 falls just within the range $P_{UPPER}$ and $P_{LOWER}$, but carrier C1 falls between $P_{LOWER}$ and $P_{MIN}$. In this region, the AGC circuit may be configured to balance the degradation of the stronger carrier (due to increased risk of clipping) against the degradation of the weaker carrier (due to too low signal strength). In order to achieve this, both carriers are considered in the AGC adjustment calculations, but SIR estimates of the individual carriers will be used to precisely decide how to set the analog gain. In general, the carrier with best SIR will get priority.

For instance, if it is assumed that carrier 2 of two carriers has the best SIR, and if the signal strength of carrier 2, $P_2$, is the weaker of the two, then the AGC circuit will calculate an analog gain adjustment that puts carrier 2 at the pre-determined threshold level $P_{LOWER}$. This may be achieved by setting:

$$\delta \tilde{g} = P_{LOWER} - P_2, \quad (10)$$

$$\delta \tilde{d}_1 = \delta d_1 - (\delta \tilde{g} - \delta g_1), \quad (11)$$

and $$\delta \tilde{d}_2 = \delta d_2 - (\delta \tilde{g} - \delta g_2), \quad (12)$$

On the other hand, if carrier 2 has the best SIR and also has the stronger signal of the two, then the AGC circuit will calculate an analog gain adjustment that puts carrier 2 at the threshold level $P_{UPPER}$. This is achieved by setting:

$$\delta \tilde{g} = P_{UPPER} - P_2, \quad (13)$$

where $\delta \tilde{g}_1$ and $\delta \tilde{d}_2$ are calculated in the same way as above. If carrier 1 has the best SIR, then the indices 1 and 2 in the two formulas above are simply interchanged.

Those skilled in the art will appreciate that since the above approach overrides the adjustments requested by the individual AGC algorithms, and instead puts the carrier with worse SIR outside the "allowed" analog gain range, then the AGC algorithm associated with that carrier will request an analog gain change whenever a new gain change for that carrier is requested. If a new analog adjustment is re-calculated for each cycle, the resulting transients due to DC offsets will happen for every cycle. To avoid this problem, hysteresis may be incorporated into the control cycle. For instance, assuming that the weaker carrier has the best SIR, a range from $P_{LOWER}$ to $P_{LOWER}+x(dB)$ may be defined to take care of small fading variations. In these embodiments, the weaker carrier is initially centered within that region. (In some embodiments, the size of the region, x, may dynamically depend on the strength of the stronger carrier.) As long as the signal strength for the weaker carrier remains within that region, all analog gain change requests are translated into corresponding digital gain changes, and the analog gain is kept unchanged. A similar approach may be adapted to the upper threshold $P_{UPPER}$ for situations in which the stronger carrier has the better SIR. In either case, if hysteresis is applied to the threshold, then a distinction must be made between how to treat the initial gain change when entering the SIR mode, and the subsequent gain changes when only DGA gain changes are made. These subsequent gain changes are then made until a new recalibration of the SIR mode is needed, e.g., when both signals fall outside the desired window, or when the AGC circuit leaves the SIR mode altogether.

Figure 3C:
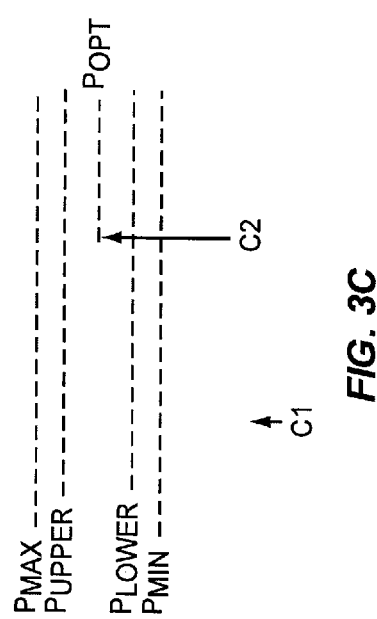

In a third operating mode, denoted "single-carrier" or "reduced-carer" mode, the difference in signal strength between the two (or more) carriers is so large that both carriers cannot simultaneously be adjusted to fall within the outer A/D operating limits $P_{MAX}$ and $P_{MIN}$, i.e., $\Delta > \Delta_2$. In this case there are two possibilities. Either the two carriers are considered equally important from a power controlling perspective, or one carrier is considered to be a so called anchor carrier. If the two carriers can be considered equally important, then the algorithm centers on the strongest carrier. As mentioned above, the "dropped" carrier is still demodulated, but will yield reduced throughput due to the low signal strength. Analog gain adjustment requests for the weaker carrier may be ignored while in single-carrier mode. Instead, the digital gains corresponding to the weakest carrier are updated so that the output from the weaker carrier will still give an output signal at the requested set point for that carrier-specific circuit. In this sub-mode of the single-carrier mode, the AGC circuit may simply adopt the gain change requests corresponding to the strongest carrier, without any changes. This means that this carrier will have its analog signal strength $P_n$ centered in the dynamic range of the input to the A/D converter, i.e., at $P_{OPT}$, as shown in FIG. 3C. Again, those skilled in the art will appreciate that hysteresis may be introduced into this operating mode as well, in order to avoid frequent toggling between single-carrier and multi-carrier modes, so that the signal levels must pass into the SIR mode with a margin of a few dB before the change in mode is actually activated.

If one carrier is an anchor carrier, then that carrier must get priority. If the anchor carrier is the stronger carrier, then the single-carrier algorithm described above is unchanged. If the anchor carrier is the weaker carrier, on the other hand, then the analog gain changes should instead be such that:

$$P_S = P_{MAX}, \quad (14)$$

where $P_S$ is the carrier signal level for the stronger carrier, with the necessary adjustments to the digital gain changes resulting from this setting.

As above, in order to avoid analog transients, an anchor carrier interval width of x dB can be defined. The stronger carrier should then be centered such that:

$$P_S = P_{MAX} - x/2. \quad (15)$$

(Typically, x must be less than $\Delta_2$ for this interval to make any sense at all.) While in single-carrier mode the AGC circuit would regulate the power with only digital gain changes so long as the signal level $P_S$ remains inside of that anchor carrier interval (assuming the anchor carrier remains the weaker carrier).

One possible concern with the above-described approach is that that the circuit may in theory, when in SIR mode, toggle between the two different carriers if they have nearly equal SIR. In practice this is not likely to happen, because the first gain change will increase the SIR of the prioritized carrier further, and worsen the SIR of the not prioritized carrier. In any event, if slowly filtered SIR values are used, the updates to the values will be less frequent, e.g., once every frame. Those skilled in the art will also appreciate that limitations in gain ranges for the analog and digital variable-gain circuits have not been expressly considered in the discussions above. If these limitations are such that the above adjustments cannot be implemented, the formulas above must be complemented with max and min values corresponding to the maximum and minimum variable-gain adjustments, as applicable. Furthermore, those skilled in the art will appreciate that the above discussion implicitly assumes that the gain range for the digital variable-gain circuit is significantly larger than the effective upper/lower and max/min limits due to the upper/ lower and max/min bounds of the input levels to the A/D converter. However, since the digital nature of this circuit provides a great deal of flexibility, this is a reasonable assumption.

Those skilled in the art will also appreciate that there may be more than one analog variable-gain amplifier in the receiver chain. The procedures described herein can readily be modified to account for boundary conditions that dictate how the analog gains should be distributed between these components; the details of these modifications will depend on the specific circuits involved and will be apparent to those skilled in the art, and are thus not discussed further herein.

Finally, the discussion above generally assumed a two carrier multi-carrier system. Those skilled in the art will appreciate that the specific techniques described above can be modified in a straightforward manner to operate on more than two carriers. For example, the generalization of the difference in amplitude, $\Delta$, to the case with more than two carriers, becomes:

$$\Delta = \max(P_1, \ldots, P_N) - \min(P_1, \ldots, P_N), \qquad (16)$$

where N is the number of carriers.

The above detailed discussion generally assumed that separate gain control loops for each of the carrier-specific receiver chains generated gain adjustment requests having two parts, i.e., an analog gain adjustment request and a digital gain adjustment. This approach may be preferred in some embodiments, so that the receiver can more easily be switched to operate with just a single received carrier, as the carrier-specific gain control loop can then operate without modification (and without assistance from a "master" gain control algorithm). On the other hand, if the individual single carrier AGC's only give their requested gains as a single value, in dB, without any information on how to distribute between different amplifiers, then an analogous implementation to the one just described can be easily developed. The difference in this case is that the "master" gain control circuit will decide how to distribute the gain changes between the various analog and digital gains based on gain adjustment requests from the carrier-specific control circuits that specify a total needed adjustment.

Assume the individual AGC's give as their output, single gain requests in dB, denoted $ak_1$ and $ak_2$ respectively, for an illustrative dual-carrier situation. The master control circuit in these embodiments is configured to store the previous gain requests as $ak_1^{old}$ and $ak_2^{old}$ respectively. Then, the gain changes in dB become:

$$\delta a\tilde{k}_1 = ak_1 - ak_1^{old}, \text{ and} \qquad (17)$$

$$\delta a\tilde{k}_2 = ak_2 - ak_2^{old}, \qquad (18)$$

For this embodiment, the same modes of operation apply as in the previous description, i.e., dual-carrier mode, SIR mode and single-carrier mode. As above, if $\Delta \leq \Delta_1$ then both carriers fit within the defined dynamic window for the dual-carrier operating mode. This mode of operation is similar to the previous version, though somewhat simpler. The condition for the gain changes to be accommodated entirely by changing the DGA gain can be expressed as the requirement that $\min(P_1, P_2) > P_{LOWER}$ and $\max(P_1, P_2) < P_{UPPER}$ must both be satisfied. In that case, the applied gain changes are simply $\delta\tilde{g} = 0$, $\delta\tilde{d}_1$, and $\delta\tilde{d}_2 = \delta a\tilde{k}_2$.

If the needed gain changes cannot be accommodated by the digital variable-gain circuits alone, then the gain control circuit adjusts the analog variable-gain circuit to center the average signal strength of the two carriers within the dynamic window for the input to the A/D converter. The digital variable-gain circuit may then be controlled to take care of any additional gain change that may be needed to reach the set point for each individual carrier. The gain changes that achieve this are given by $$\delta\tilde{g} = P_{OPT} - \frac{P_1 + P_2}{2},$$

$\delta\tilde{d}_1 = \delta a\tilde{k}_1 - \delta\tilde{g}$, and $\delta\tilde{d}_2 = \delta a\tilde{k}_2 - \delta\tilde{g}$.

If the difference between the carrier signal levels is such that the carriers cannot be adjusted to fall between $P_{UPPER}$ and $P_{LOWER}$ at the A/D converter input, but can be simultaneously adjusted to fall between $P_{MAX}$ and $P_{MIN}$, then the gain control circuit enters SIR mode. As in the earlier description, if we assume that carrier 2 has the best SIR, then if the signal strength of carrier 2, $P_2$, is the weaker signal of the two, the gain control circuit will adjust the analog variable-gain circuit so that carrier 2 is placed at or near the lower end of the pre-determined input window for the A/D converter, i.e., at $P_{LOWER}$. This is achieved by setting: $\delta\tilde{g} = P_{LOWER} - P_2$, $\delta\tilde{d}_1 = \delta a\tilde{k}_1 - \delta\tilde{g}$, and $\delta\tilde{d}_2 = \delta a\tilde{k}_2 - \delta\tilde{g}$. On the other hand, if the signal strength of carrier 2, $P_2$, is the stronger signal of the two, then the gain control circuit will adjust the analog variable-gain circuit so that carrier 2 falls at or near the other end of the pre-determined input window for the A/D converter, i.e., at $P_{UPPER}$. This is achieved by setting: $\delta\tilde{g} = P_{UPPER} - P_2$, $\delta\tilde{d}_1 = \delta a\tilde{k}_1 - \delta\tilde{g}$, and $\delta\tilde{g}_2 = \delta a\tilde{k}_2 - \delta\tilde{g}$. If carrier 1 has the best SIR, then the indices 1 and 2 may simply be interchanged in the above equations.

In the third operating mode, single-carrier mode, the gain changes can be executed analogously with the original proposal for single carrier mode. Thus, if no carrier has priority over the other, or if the priority carrier is also the strongest carrier, then the gain control circuit simply adjusts the analog variable-gain circuit so that the stronger carrier is centered on the A/D converter's input operating window. If one carrier is prioritized, and is weaker than the other, then the stronger carrier is instead adjusted to fall at or near the top end of the A/D converter's absolute operating limit.

With the above-described automatic gain control techniques in mind, those skilled in the art will appreciate that FIG. 5 illustrates a general method for of processing a received multi-carrier signal according to some embodiments of the present invention. Although the illustrated method references only first and second carrier-specific signals, those skilled in the art will understand that the illustrated processing is not limited to multi-carrier signals with two component carriers, and that the processes and circuits described herein may be readily expanded for use with multi-carrier signals having three or more component signals. Those skilled in the art will further appreciate that the method illustrated in FIG. 5 (as well as the methods illustrated in FIGS. 6-9) may be implemented in the wireless receiver of FIG. 2 and/or using the baseband processing circuit illustrated in FIG. 4, as discussed above, or in another wireless receiver configured to receive and process a multi-carrier signal.

As shown at block 510, the received multi-carrier signal is amplified, downconverted, as applicable, and digitized. Based on signal level measurements for each of the carriers of the multi-carrier signal, a common analog gain adjustment and carrier-specific digital gain adjustments are calculated, as shown at block 520. The common analog gain adjustment is applied to the received multi-carrier signal using an analog variable-gain circuit, as shown at block 530. First and second carrier-specific signals are extracted from the multi-carrier signal, as shown at block 540, and the carrier-specific digital gain adjustments, are applied separately to the first and second carrier-specific signals, as shown at block 550. Of course, those skilled in the art will appreciate that the general technique illustrated in FIG. 5 are not necessarily carried out in the precise order pictured. In particular, it will be understood that the application of the analog variable-gain (shown at block 530), the extraction of the first and second carrier-specific signals (shown at block 540), and the application of the digital variable gains (shown at block 550) are generally continuous processes, with adjustments to the gain settings applied occasionally, or periodically. Thus, in some embodiments, measurements of the carrier-specific signals are made over a pre-defined period, gain adjustments calculated from those measurements (as shown at block 520), and the gain adjustments applied to the analog and digital variable-gain circuits more-or-less simultaneously.

Figure 9:
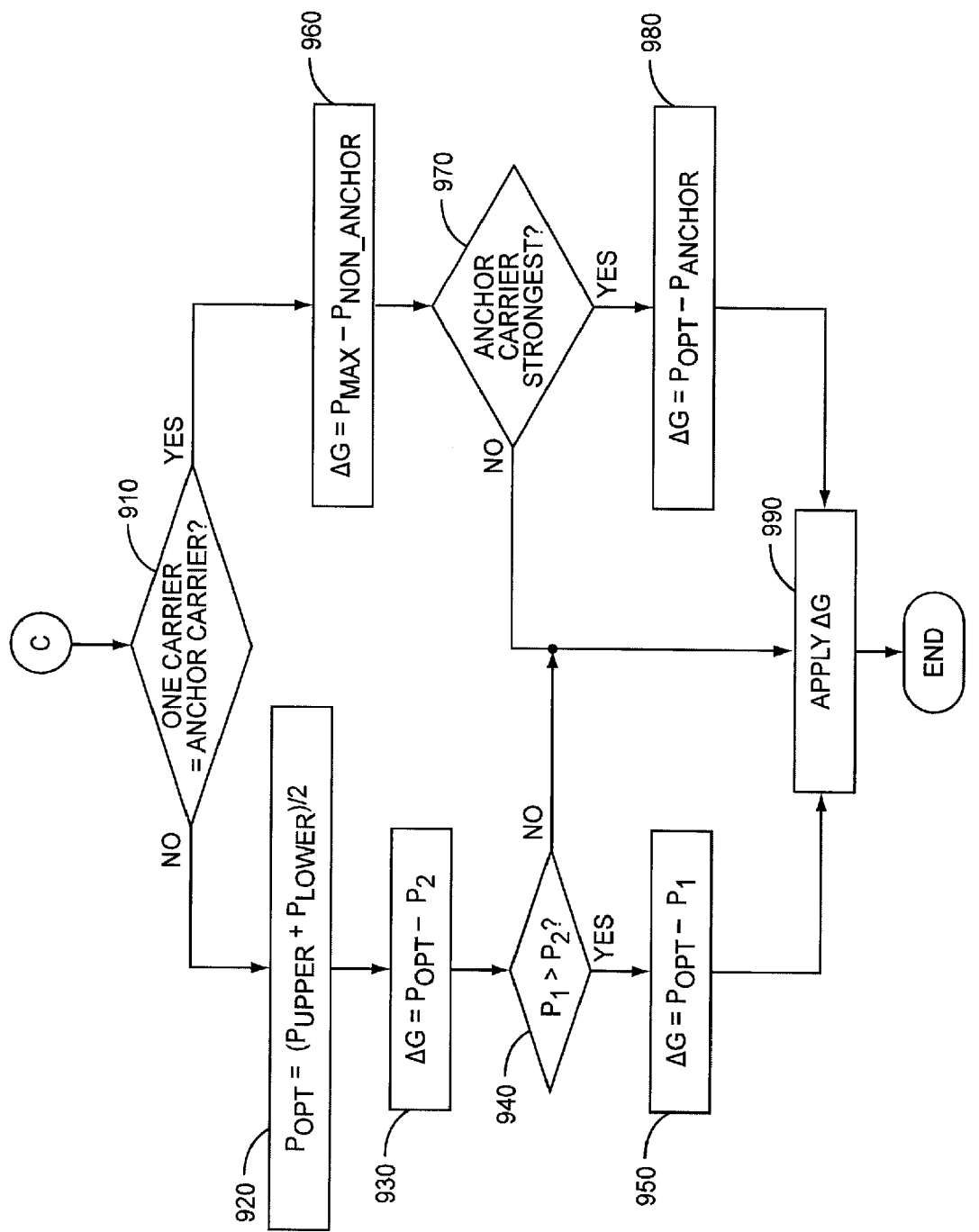

As described above, an automatic gain control circuit according to some embodiments of the invention may be configured to selectively operate in one of several modes, based on the difference between carrier signal levels for first and second carriers of a multi-carrier signal. FIG. 6 illustrates an exemplary process for selecting these operating modes, while FIGS. 7, 8, and 9 illustrate exemplary details for a dual-carrier mode, SIR mode, and single-carrier mode, respectively. Although these processes are described below with respect to first and second carriers of a multi-carrier signal, those skilled in the art will appreciate that the present invention is not limited to dual-carrier signals, and that the techniques illustrated herein may be applied to multi-carrier signals having more than two carriers.

In any case, the process illustrated in FIG. 6 "begins," as shown at block 610 with the measuring of first and second carrier signal levels and first and second SIR values for the first and second carriers of the multi-carrier signal. (Of course, those skilled in the art will appreciate that the mode selection process illustrated in FIG. 6 may be repeated, as necessary, to account for changing signal conditions.)

As shown at block 620, the absolute difference between the carrier signal levels is calculated; this difference is used to select one of the three operating modes described above. In particular, as shown at block 630, if the difference is less than a first threshold value, here defined by the preferred A/D operating window $P_{UPPER}$ to $P_{LOWER}$, then mode "A" is selected. As will be seen in the discussion of FIG. 7, mode "A" corresponds to the earlier-described dual-carrier mode or all-carrier mode.

If the difference between the carrier signal levels is greater than the first threshold value, but is less than a second threshold value, here defined by the operating limits of the A/D converter $P_{MAX}$ to $P_{MIN}$, then mode "B" is selected. Otherwise, mode "C" is selected. As will be seen in the discussions of FIGS. 8 and 9, mode "B" corresponds to the earlier-described SIR mode, while mode "C" corresponds to the single-carrier, or "dropped-carrie" mode.

Referring now to FIG. 7, if the gain control circuit is operating in dual-carrier mode, then an average value is calculated for the first and second carriers, as shown at block 710. As shown at block 720, an "optimal" input level for the A/D converter may be determined by averaging the upper and lower limits of the preferred A/D operating window, e.g., by calculating $P_{OPT}=(P_{UPPER}+P_{LOWER})/2$. Of course, those skilled in the art will recognize that this value may be pre-calculated and stored in memory, in some embodiments, or may be set at some level other than the middle of the operating window. In any event, an analog gain adjustment ΔG is calculated so that the average of the first and second carrier signal levels $P_1$ and $P_2$ falls at or near the optimal input level for the A/D converter. As shown at block 730, this may be done by calculating $\Delta G=P_{OPT}-(P_1+P_2)/2$. (Recall that $P_1$ and $P_2$ in this calculation are the carrier signal levels, before the gain adjustment, referred to the A/D converter input.) The calculated gain adjustment is then applied to the analog variable-gain circuit, as shown at block 740.

Although not shown in FIG. 7, digital gain adjustments may then be calculated to ensure that each carrier is at the proper level in the carrier-specific chains. Subsequent variations in the signal level may be compensated by adjusting the digital gain adjustments alone, until one of the carriers slips outside of the A/D converter's preferred operating window, in which case a new analog gain adjustment is made, or until the difference between the carrier signal levels is such that selection of a new operating mode is necessary.

Referring now to FIG. 8, those skilled in the art will recall that mode "B", or SIR mode, is selected if the difference between the carrier levels is such that both carriers cannot be adjusted to fall within the inner A/D operating window, but can be adjusted to fall within the outer window. SIR mode begins, as shown at block 810, with a determination of which of the two carriers has the higher signal-to-interference (SIR) ratio. If the SIR for carrier 2 (SIR2) is higher than that of carrier 1 (SIR1), then processing proceeds as shown on the left-hand side of FIG. 8. First, the gain control circuit calculates a tentative analog gain adjustment so that carrier 2 is placed at or near the upper end of the inner A/D operating window, e.g., by calculating $\Delta G=P_{UPPER}-P_2$ as shown at block 820. (Again, $P_2$ in this calculation is the carrier signal level for carrier 2, before the gain adjustment, referred to the A/D converter input.) If carrier 2 is the stronger signal, as determined at block 830, then the gain adjustment calculated at block 820 is correct, and may be applied to the analog variable-gain circuit (block 850). If carrier 2 is the weaker signal, on the other hand, then carrier 2 should be placed at the lower end of the A/D's inner window. Thus, as shown at block 840, the gain adjustment may be calculated as $\Delta G=P_{LOWER}-P_2$. Of course, those skilled in the art will appreciate that the illustrated processing details represent but one of several possible equivalent approaches.

If the SIR for carrier 2 is lower than that of carrier 1, the process follows the right-hand side of FIG. 8. Those skilled in the art will recognize that the processing of blocks 825, 835, 845 directly corresponds to that of blocks 820, 830, 840, but with the indices for the carriers reversed. In either case, the calculated gain adjustment is finally applied to the analog variable-gain circuit, as shown at block 850.

As with the dual-carrier mode described above, carrier-specific digital gain adjustments may then be calculated based on the calculated analog gain adjustment and the carrier signal levels. Subsequent variations in the signal level may be compensated by adjusting the digital gain adjustments alone, until the SIR values change so that the other carrier should have priority, or until the higher-priority carrier slips outside of the A/D converter's preferred operating window, or until the difference between the carriers changes so that either dual-carrier mode or dropped-carrier mode becomes appropriate.

FIG. 9 illustrates exemplary details for a dropped-carrier mode; those skilled in the art will recall that mode "C", or dropped-carrier mode, is selected if the difference between the carrier levels is greater than the outer A/D operating window, such that the common analog variable-gain circuit cannot be adjusted to fit both carriers within that window. In the exemplary process illustrated in FIG. 9, dropped-carrier mode begins, as shown at block 810, with a determination of whether one carrier is a higher-priority, or "anchor," carrier. If not, then the stronger carrier is prioritized, and processing proceeds as shown on the left-hand side of FIG. 9. First, the gain control circuit calculates the optimal level for the A/D input, as shown at block 920. Then, a tentative analog gain adjustment is calculated so that the stronger of carriers 1 and 2 is placed at the optimal input level. In the pictured process, this is done by tentatively placing carrier 2 at the optimal input level, as shown at block 930, determining whether carrier 2 is the stronger signal, as shown at block 940, and re-calculating the gain adjustment to place carrier 1 at the optimal level, if carrier 1 is the stronger signal. The calculated gain adjustment is then applied to the analog variable-gain circuit, as shown at block 990. Again, those skilled in the art will appreciate that the illustrated processing details represent but one of several possible equivalent approaches; the exact approach taken may depend on constraints imposed by programmed hardware or may simply depend on personal preference.

If one of the carriers is an anchor carrier, then processing proceeds according to the right-hand side of FIG. 9. In the illustrated process, a tentative analog gain adjustment is calculated so that the carrier that is not the anchor carrier is placed at the upper end of the outer A/D converter operating window, i.e., at $P_{MAX}$, as shown at block 960. At block 970, this tentative calculation is confirmed if the anchor carrier is the weaker of the two. Otherwise, a new analog gain adjustment is calculated so that the anchor carrier is placed at or near the optimal input level for the A/D converter, as shown at block 980. This gain adjustment is then applied to the analog variable-gain adjustment, as shown at block 990.

Once again, carrier-specific digital gain adjustments may then be calculated based on the calculated analog gain adjustment and the carrier signal levels. Subsequent variations in the signal level may be compensated by adjusting the digital gain adjustments alone, until the relative priorities of the carriers change, until the difference between the carriers changes so that SIR mode becomes appropriate, etc.

With the above variations and examples in mind, those skilled in the art will appreciate that the preceding descriptions of various embodiments of methods and apparatus for processing a received multi-carrier signal are given for purposes of illustration and example. As suggested above, one or more of the specific processes discussed above, including the process flows illustrated in FIGS. 5-9, may be carried out in a wireless receiver which in turn is part of a wireless user terminal, such as a cellular phone, wireless-enabled computer or portable digital assistant, or the like. The wireless receiver comprises one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the processes described above, or variants thereof. In some embodiments, these processing circuits may comprise customized hardware to carry out one or more of the functions described above. Other embodiments of the invention may include computer-readable devices, such as a programmable flash memory, an optical or magnetic data storage device, or the like, encoded with computer program instructions which, when executed by an appropriate processing device, cause the processing device to carry out one or more of the techniques described herein for estimating receiver frequency offset in a communications receiver.

Those skilled in the art will recognize, of course, that the present invention may be carried out in other ways than those specifically set forth herein without departing from essential characteristics of the invention. For instance, although some of the embodiments illustrated and described herein are configured to process only a two-carrier multi-carrier signal, the inventive techniques disclosed and claimed are not so limited, and can be readily extended to apply to multi-carrier signals having more than two component carriers. The present embodiments are thus to be considered in all respects as illustrative and not restrictive, and all changes coming within the meaning and equivalency range of the appended claims are intended to be embraced therein.

What is claimed is:

1. A receiver circuit for processing a received multi-carrier signal, comprising:
 a common analog signal path for conditioning the received multi-carrier signal and converting the received multi-carrier signal into digital form, the common analog signal path comprising an analog variable-gain circuit and an analog-to-digital converter;
 first and second carrier-specific, digital variable-gain circuits corresponding to first and second carriers of the received multi-carrier signal, respectively; and
 a gain control circuit configured to:
  control the analog variable-gain circuit and the digital variable-gain circuits; and to
  selectively operate in an all-carrier mode or in one of one or more unequal-priority modes based on a difference between carrier signal levels of the first and second carriers, wherein an all-carrier mode is selected when the difference between the first and second carrier signal levels is less than a first pre-determined threshold;
  calculate gain adjustments for the analog variable-gain circuit based on an average of the first and second carrier signal levels and a pre-determined optimal input level for the analog-to-digital converter while in said all-carrier mode;
  calculate gain adjustments for the analog variable-gain circuit from only one of the first and second carrier signal levels while in said unequal-priority mode; and
  allot the gain adjustments to the analog variable-gain circuit.

2. The receiver circuit of claim 1, wherein the one or more unequal-priority modes comprise an SIR mode, in which the gain control circuit is configured to calculate gain adjustments for the analog variable-gain circuit based on the carrier signal level for the one of the first and second carriers having the higher signal-to-interference (SIR) ratio.

3. The receiver circuit of claim 2, wherein the gain control circuit is configured to operate in the SIR mode when the difference between the first and second carrier signal levels is between first and second pre-determined thresholds, and to calculate gain adjustments for the analog variable-gain circuit, when in the SIR mode, based on the carrier signal level for the one of the first and second carriers having the higher signal-to-interference ratio and a selected one of two pre-determined target input levels for the analog-to-digital converter.

4. The receiver circuit of claim 3, wherein the gain control circuit is further configured to select the upper one of the two pre-determined target input levels for calculating the adjustments when the carrier having the higher signal-to-interference ratio also has the higher carrier signal level and to select the lower one of the two pre-determined target input levels for calculating the adjustments when the carrier having the higher signal-to-interference ratio has the lower carrier signal level.

5. The receiver circuit of claim 1, wherein the one or more unequal-priority modes comprise a dropped-carrier mode, in which the gain control circuit is configured to calculate gain adjustments for the analog variable-gain circuit based on the higher of the first and second carrier signal levels.

6. The receiver circuit of claim 5, wherein the gain control circuit is configured to operate in the dropped-carrier mode when the difference between the first and second carrier signal levels is greater than a pre-determined maximum threshold, and to calculate gain adjustments for the analog variable-gain circuit, when in the dropped-carrier mode, based on the higher of the first and second carrier signal levels and a selected one of a pre-determined optimal input level for the analog-to-digital converter and a pre-determined maximum input level for the analog-to-digital converter.

7. The receiver circuit of claim 6, wherein the gain control circuit is further configured to, when in the dropped-carrier mode:
   determine whether the carrier having the lower signal level is deemed to have higher priority;
   base the calculated gain adjustments for the analog variable-gain circuit on the pre-determined maximum input level and the higher of the carrier signal levels when the carrier having the lower signal level is deemed to have higher priority; and
   otherwise base the calculated gain adjustments for the analog variable-gain circuit on the pre-determined optimum input level and the higher of the carrier signal levels.

8. A method in a wireless receiver for processing a received multi-carrier signal, comprising:
   conditioning the received multi-carrier signal and converting the received multi-carrier signal into a digital signal, using a common analog signal path comprising an analog variable-gain circuit and an analog-to-digital converter;
   extracting first and second carrier-specific signals from the digital signal;
   adjusting gains applied to the first and second carrier-specific signals using first and second carrier-specific, digital variable-gain circuits, respectively;
   selecting an all-carrier mode or one of one or more unequal-priority modes based on a difference between carrier signal levels of the first and second carriers, wherein an all-carrier mode is selected when the difference between the first and second carrier signal levels is less than a first pre-determined threshold;
   calculate gain adjustments for the analog variable-gain circuit based on an average of the first and second carrier signal levels and a pre-determined optimal input level for the analog-to-digital converter while in said all-carrier mode;
   calculate gain adjustments for the analog variable-gain circuit from only one of the first and second carrier signal levels while in said unequal-priority mode; and
   allotting the gain adjustments to the analog variable-gain circuit.

9. The method of claim 8 comprising selecting the all-carrier mode when the difference between the first and second carrier signal levels is less than a first pre-determined threshold, and calculating gain adjustments for the analog variable-gain circuit, when in the all-carrier mode, based on an average of the first and second carrier signal and a pre-determined optimal input level for the analog-to-digital converter.

10. The method of claim 8, wherein the one or more unequal-priority modes comprise an SIR mode, in which gain adjustments for the analog variable-gain circuit are calculated based on the carrier signal level for the one of the first and second carriers having the higher signal-to-interference ratio (SIR).

11. The method of claim 10, comprising selecting the SIR mode when the difference between the first and second carrier signal levels is between first and second pre-determined thresholds, and calculating gain adjustments for the analog variable-gain circuit, when in the SIR mode, based on the carrier signal level for the one of the first and second carriers having the higher signal-to-interference ratio and a selected one of two pre-determined target input levels for the analog-to-digital converter.

12. The method of claim 11, further comprising selecting the upper one of the two pre-determined target input levels for calculating the gain adjustments when the carrier having the higher signal-to-interference ratio also has the higher carrier signal level and selecting the lower one of the two pre-determined target input levels for calculating the gain adjustments when the carrier having the higher signal-to-interference ratio has the lower carrier signal level.

13. The method of claim 8, wherein the one or more unequal-priority modes comprise a dropped-carrier mode, in which gain adjustments for the analog variable-gain circuit are calculated based on the higher of the first and second carrier signal levels.

14. The method of claim 13, further comprising selecting the dropped-carrier mode when the difference between the first and second carrier signal levels is greater than a pre-determined maximum threshold, and calculating gain adjustments for the analog variable-gain circuit, when in the dropped-carrier mode, based on the higher of the first and second carrier signal levels and a selected one of a pre-determined optimal input level for the analog-to-digital converter and a pre-determined maximum input level for the analog-to-digital converter.

15. The method of claim 14, further comprising, when in the dropped-carrier mode:
   determining whether the carrier having the lower signal level is deemed to have higher priority;
   basing calculated gain adjustments for the analog variable-gain circuit on the pre-determined maximum input level and the higher of the carrier signal levels when the carrier having the lower signal level is deemed to have higher priority; and
   otherwise basing the calculated gain adjustments for the analog variable-gain circuit on the pre-determined optimum input level and the higher of the carrier signal levels.

16. A wireless user terminal comprising a receiver circuit for processing a received multi-carrier signal, the receiver circuit comprising:
   a common analog signal path for conditioning the received multi-carrier signal and converting the received multi-carrier signal into digital form, the common analog signal path comprising an analog variable-gain circuit and an analog-to-digital converter;
   first and second carrier-specific, digital variable-gain circuits corresponding to first and second carriers of the received multi-carrier signal, respectively; and
   a gain control circuit configured to:
      control the analog variable-gain circuit and the digital variable-gain circuits;
      selectively operate in an all-carrier mode or in one of one or more unequal-priority modes based on a difference between carrier signal levels of the first and second carriers, wherein an all-carrier mode is selected when the difference between the first and second carrier signal levels is less than a first pre-determined threshold;

calculate gain adjustments for the analog variable-gain circuit based on an average of the first and second carrier signal levels and a pre-determined optimal input level for the analog-to-digital converter while in said all-carrier mode;

calculate gain adjustments for the analog variable-gain circuit based on the carrier signal level for the one of the first and second carriers having the higher signal-to-interference (SIR) ratio while in said unequal-priority mode and when said unequal-priority mode is an SIR mode; and allot the gain adjustments to the analog variable-gain circuit.

17. A receiver circuit for processing a received multi-carrier signal, comprising:

a common analog signal path for conditioning the received multi-carrier signal and converting the received multi-carrier signal into digital form, the common analog signal path comprising an analog variable-gain circuit and an analog-to-digital converter;

first and second carrier-specific, digital variable-gain circuits corresponding to first and second carriers of the received multi-carrier signal, respectively; and a gain control circuit configured to;
control the analog variable-gain circuit and the digital variable-gain circuits; and to
selectively operate in an all-carrier mode or in one of one or more unequal-priority modes based on a difference between carrier signal levels of the first and second carriers, wherein the one or more unequal-priority modes comprise SIR modes;
calculate gain adjustments for the analog variable-gain circuit from both of the first and second carrier signal levels while in said all-carrier mode;
calculate gain adjustments for the analog variable-gain circuit based on the carrier signal level for only one of the first and second carriers having the higher signal-to-interference (SIR) ratio while in said SIR mode; and
allot the gain adjustments to the analog variable-gain circuit.

18. The receiver circuit of claim 17, wherein the gain control circuit is configured to operate in the SIR mode when the difference between the first and second carrier signal levels is between first and second pre-determined thresholds, and to calculate gain adjustments for the analog variable-gain circuit, when in the SIR mode, based on the carrier signal level for the one of the first and second carriers having the higher signal-to-interference ratio and a selected one of two pre-determined target input levels for the analog-to-digital converter.

19. The receiver circuit of claim 18, wherein the gain control circuit is further configured to select the upper one of the two pre-determined target input levels for calculating the adjustments when the carrier having the higher signal-to-interference ratio also has the higher carrier signal level and to select the lower one of the two pre-determined target input levels for calculating the adjustments when the carrier having the higher signal-to-interference ratio has the lower carrier signal level.

20. A receiver circuit for processing a received multi-carrier signal, comprising:

a common analog signal path for conditioning the received multi-carrier signal and converting the received multi-carrier signal into digital form, the common analog signal path comprising an analog variable-gain circuit and an analog-to-digital converter;

first and second carrier-specific, digital variable-gain circuits corresponding to first and second carriers of the received multi-carrier signal, respectively; and a gain control circuit configured to;
control the analog variable-gain circuit and the digital variable-gain circuits; and to
selectively operate in an all-carrier mode or in one of one or more unequal-priority modes based on a difference between carrier signal levels of the first and second carriers, wherein the one or more unequal-priority modes comprises a dropped-carrier mode that is selected when the difference between the first and second carrier signal levels is greater than a pre-determined maximum threshold;
calculate gain adjustments for the analog variable-gain circuit from both of the first and second carrier signal levels while in said all-carrier mode;
calculate gain adjustments for the analog variable-gain circuit based on the carrier signal level for the one of the first and second carriers having the higher signal level and a selected one of a pre-determined optimal input level for the analog-to-digital converter and a pre-determined maximum input level for the analog-to-digital converter while in said dropped-carrier mode; and
allot the gain adjustments to the analog variable-gain circuit.

21. The receiver circuit of claim 20, wherein the gain control circuit is further configured to, when in the dropped-carrier mode:

determine whether the carrier having the lower signal level is deemed to have higher priority;
base the calculated gain adjustments for the analog variable-gain circuit on the pre-determined maximum input level and the higher of the carrier signal levels when the carrier having the lower signal level is deemed to have higher priority; and
otherwise base the calculated gain adjustments for the analog variable-gain circuit on the pre-determined optimum input level and the higher of the carrier signal levels.

22. A method in a wireless receiver for processing a received multi-carrier signal, comprising:

conditioning the received multi-carrier signal and converting the received multi-carrier signal into a digital signal, using a common analog signal path comprising an analog variable-gain circuit and an analog-to-digital converter;
extracting first and second carrier-specific signals from the digital signal;
adjusting gains applied to the first and second carrier-specific signals using first and second carrier-specific, digital variable-gain circuits, respectively;
selecting an all-carrier mode or one of one or more unequal-priority modes based on a difference between carrier signal levels of the first and second carriers, wherein the one or more unequal-priority modes comprises an SIR mode;
calculate gain adjustments for the analog variable-gain circuit based on an average of the first and second carrier signal levels and a pre-determined optimal input level for the analog-to-digital converter while in said all-carrier mode;
calculate gain adjustments for the analog variable-gain circuit based on the carrier signal level for only one of the first and second carriers having the higher signal-to-interference ratio (SIR) while in said SIR mode; and allotting the gain adjustments to the analog variable-gain circuit.

23. The method of claim 22, comprising selecting the SIR mode when the difference between the first and second carrier signal levels is between first and second pre-determined thresholds, and calculating gain adjustments for the analog variable-gain circuit, when in the SIR mode, based on the carrier signal level for the one of the first and second carriers having the higher signal-to-interference ratio and a selected one of two pre-determined target input levels for the analog-to-digital converter.

24. The method of claim 23, further comprising selecting the upper one of the two pre-determined target input levels for calculating the gain adjustments when the carrier having the higher signal-to-interference ratio also has the higher carrier signal level and selecting the lower one of the two pre-determined target input levels for calculating the gain adjustments when the carrier having the higher signal-to-interference ratio has the lower carrier signal level.

25. A method in a wireless receiver for processing a received multi-carrier signal, comprising:

conditioning the received multi-carrier signal and converting the received multi-carrier signal into a digital signal, using a common analog signal path comprising an analog variable-gain circuit and an analog-to-digital converter;

extracting first and second carrier-specific signals from the digital signal;

adjusting gains applied to the first and second carrier-specific signals using first and second carrier-specific, digital variable-gain circuits, respectively;

selecting an all-carrier mode or one of one or more unequal-priority modes based on a difference between carrier signal levels of the first and second carriers, wherein the one or more unequal-priority modes comprises a dropped-carrier mode that is selected when the difference between the first and second carrier signal levels is greater than a pre-determined maximum threshold;

calculate gain adjustments for the analog variable-gain circuit based on an average of the first and second carrier signal levels and a pre-determined optimal input level for the analog-to-digital converter while in said all-carrier mode;

calculate gain adjustments for the analog variable-gain circuit based on the carrier signal level for only one of the first and second carriers having the higher signal-to-interference ratio (SIR) while in said SIR mode; and allotting the gain adjustments to the analog variable-gain circuit.

26. The method of claim 25, further comprising, when in the dropped-carrier mode:

determining whether the carrier having the lower signal level is deemed to have higher priority;

basing calculated gain adjustments for the analog variable-gain circuit on the pre-determined maximum input level and the higher of the carrier signal levels when the carrier having the lower signal level is deemed to have higher priority; and otherwise basing the calculated gain adjustments for the analog variable-gain circuit on the pre-determined optimum input level and the higher of the carrier signal levels.

* * * * *

UNITED STATES PATENT AND TRADEMARK OFFICE
CERTIFICATE OF CORRECTION

PATENT NO. : 8,160,527 B2
APPLICATION NO. : 12/414202
DATED : April 17, 2012
INVENTOR(S) : Jonsson et al.

It is certified that error appears in the above-identified patent and that said Letters Patent is hereby corrected as shown below:

In Column 8, Line 45, delete "$P_1=20 \log_{,10}$" and insert -- $P_1=20 \log_{10}$ --, therefor.

In Column 9, Line 12, delete "$P_{MIN}$ In" and insert -- $P_{MIN}$. In --, therefor.

In Column 10, Line 22, delete "$\Delta \leq \Delta,$" and insert -- $\Delta \leq \Delta_1$ --, therefor.

In Column 11, Line 34, delete "$\delta \tilde{g}_1$" and insert -- $\delta \bar{d}_1$ --, therefor.

In Column 11, Line 67, delete ""reduced-carer"" and insert -- "reduced-carrier" --, therefor.

In Column 13, Line 62, delete "$\delta \tilde{d}_1$" and insert -- $\delta \bar{d}_1 = \delta a \bar{k}_1$ --, therefor.

In Column 14, Line 29, delete "$\delta \tilde{g}_2$" and insert -- $\delta \bar{d}_2$ --, therefor.

In Column 15, Line 55, delete ""dropped-carier"" and insert -- "dropped-carrier" --, therefor.

Signed and Sealed this
Fourth Day of September, 2012

David J. Kappos
*Director of the United States Patent and Trademark Office*